(12) United States Patent
Schelling et al.

(10) Patent No.: US 9,403,670 B2
(45) Date of Patent: Aug. 2, 2016

(54) MEMS DEVICE HAVING A MICROPHONE STRUCTURE, AND METHOD FOR THE PRODUCTION THEREOF

(71) Applicants: Christoph Schelling, Stuttgart (DE); Stefan Singer, Reutlingen (DE); Jochen Zoellin, Muellheim (DE)

(72) Inventors: Christoph Schelling, Stuttgart (DE); Stefan Singer, Reutlingen (DE); Jochen Zoellin, Muellheim (DE)

(73) Assignee: ROBERT BOSCH GMBH, Stuttgart (DE)

(*) Notice: Subject to any disclaimer, the term of this patent is extended or adjusted under 35 U.S.C. 154(b) by 29 days.

(21) Appl. No.: 14/327,180

(22) Filed: Jul. 9, 2014

(65) Prior Publication Data

US 2015/0014797 A1 Jan. 15, 2015

(30) Foreign Application Priority Data

Jul. 12, 2013 (DE) .......................... 10 2013 213 717

(51) Int. Cl.
| | |
|---|---|
| H01L 29/84 | (2006.01) |
| B81B 3/00 | (2006.01) |
| B81C 1/00 | (2006.01) |
| H04R 19/00 | (2006.01) |

(52) U.S. Cl.
CPC ............. B81B 3/0059 (2013.01); B81B 3/0072 (2013.01); B81C 1/00158 (2013.01); B81C 1/00666 (2013.01); H04R 19/005 (2013.01); B81B 2201/0257 (2013.01); B81B 2201/0264 (2013.01); B81B 2203/0127 (2013.01); H04R 2201/003 (2013.01)

(58) Field of Classification Search
None
See application file for complete search history.

(56) References Cited

U.S. PATENT DOCUMENTS

| | | | | |
|---|---|---|---|---|
| 5,870,482 | A * | 2/1999 | Loeppert | B81B 3/0072 381/174 |
| 5,888,412 | A * | 3/1999 | Sooriakumar | G01L 9/0042 216/2 |
| 6,488,367 | B1 * | 12/2002 | Debesis | B41J 2/1607 347/70 |
| 7,438,030 | B1 * | 10/2008 | Okojie | F16K 99/0001 123/90.11 |
| 7,536,769 | B2 * | 5/2009 | Pedersen | B81B 3/0072 156/89.11 |
| 7,701,110 | B2 * | 4/2010 | Fukuda | B06B 1/0292 310/309 |
| 8,464,589 | B2 * | 6/2013 | Lee | B81B 3/0072 361/283.1 |
| 8,587,078 | B2 * | 11/2013 | Huang | B81C 1/00246 257/254 |
| 9,126,827 | B2 * | 9/2015 | Hsieh | B81B 3/00 |
| 2002/0067663 | A1 * | 6/2002 | Loeppert | B81B 3/0072 367/181 |
| 2008/0247573 | A1 * | 10/2008 | Pedersen | H04R 19/005 381/174 |

(Continued)

Primary Examiner — David E Graybill
(74) Attorney, Agent, or Firm — Norton Rose Fulbright US LLP

(57) ABSTRACT

A microphone structure of an MEMS device has a layer construction including: a base substrate; a deflectable microphone diaphragm at least partly spanning a through-opening in the substrate; a deflectable electrode of a microphone condenser system; a stationary counter-element having ventilation openings situated in the layer construction over the microphone diaphragm and acting as a bearer for a stationary electrode of the microphone condenser system. The diaphragm is bonded into the layer construction on the substrate via a flexible beam. The otherwise free edge region of the diaphragm is curved in a pan shape, so that it extends both vertically and also in some regions laterally beyond the edge region of the through-opening, and the edge region of the through-opening forms a lower stop for the diaphragm movement.

4 Claims, 8 Drawing Sheets

(56) References Cited

U.S. PATENT DOCUMENTS

| | | | |
|---|---|---|---|
| 2009/0116675 A1* | 5/2009 | Miyoshi | B81B 3/0072 381/369 |
| 2010/0065930 A1* | 3/2010 | Nakatani | B81C 1/00476 257/415 |
| 2010/0096714 A1* | 4/2010 | Nakatani | G01L 9/0042 257/419 |
| 2011/0241137 A1* | 10/2011 | Huang | B81C 1/00246 257/419 |
| 2011/0266640 A1* | 11/2011 | Kasai | H04R 19/04 257/416 |
| 2011/0278683 A1* | 11/2011 | Kasai | H04R 19/005 257/416 |
| 2011/0311081 A1 | 12/2011 | Kim | |
| 2012/0090398 A1* | 4/2012 | Lee | B81B 3/0072 73/715 |
| 2012/0091546 A1* | 4/2012 | Langereis | B81B 3/0072 257/416 |
| 2012/0098076 A1* | 4/2012 | Lee | H04R 19/02 257/416 |
| 2013/0336095 A1* | 12/2013 | Seppa | G01L 9/0016 367/137 |
| 2014/0015070 A1* | 1/2014 | Zoellin | B81B 3/0021 257/416 |
| 2014/0291786 A1* | 10/2014 | Zoellin | H04R 19/04 257/416 |
| 2014/0367811 A1* | 12/2014 | Nakagawa | H04R 19/005 257/416 |
| 2014/0374859 A1* | 12/2014 | Kasai | H04R 19/005 257/419 |
| 2015/0104048 A1* | 4/2015 | Uchida | H04R 7/06 381/174 |
| 2015/0156576 A1* | 6/2015 | Uchida | H04R 7/06 381/174 |

* cited by examiner

MEMS DEVICE HAVING A MICROPHONE STRUCTURE, AND METHOD FOR THE PRODUCTION THEREOF

BACKGROUND OF THE INVENTION

1. Field of the Invention

The present invention relates to a MEMS device having a microphone structure, and to a method for the production thereof.

2. Description of the Related Art

The microphone structure is realized in a layer construction on a base substrate; it includes a deflectable microphone diaphragm and a stationary counter-element having ventilation openings. The microphone diaphragm spans a through-opening in the base substrate, the mid-region of the microphone diaphragm being essentially plane-parallel to the substrate plane and, in the rest state, being situated inside the through-opening in the base substrate. The microphone diaphragm is provided with at least one deflectable electrode of a microphone condenser system. The stationary counter-element is configured in a layer construction over the microphone diaphragm, and acts as bearer for at least one stationary electrode of the microphone condenser system.

Such a microphone device is described in US Patent Application Publication No. 2011/0311081 A1. Here, the microphone diaphragm is applied in the form of a metallic layer in the floor region of a recess in the surface of the base substrate. Subsequently, the counter-element is realized in a layer construction on the surface of the base substrate. As a consequence, the spacing between the microphone diaphragm and the counter-element is here essentially determined by the depth of the recess in the substrate surface. The metallic microphone diaphragm is bonded to the layer construction on the substrate surface via a dielectric coating on the side wall of the recess. The metallic microphone diaphragm, together with its dielectric suspension, is also exposed at the rear side only after the rear side etching process in which the through-opening in the base substrate is produced, so that the diaphragm spans this through-opening. Corresponding to the depth and shape of the recess in the substrate surface, the metallic mid-region of the microphone diaphragm is situated under the substrate surface and is oriented parallel to the substrate plane.

The device design described in US Patent Application Publication No. 2011/0311081 A1 enables the realization of micromechanical microphone structures having a relatively large gap spacing between the microphone diaphragm and counter-element, which has a positive effect on the microphone performance. Because here the microphone diaphragm is sunk into the substrate plane, this gap spacing can be achieved with a comparatively low constructive height of the device.

However, the known microphone device is also problematic in several ways.

Thus, the combination of the metallic diaphragm material with the dielectric material of the diaphragm suspension necessarily causes mechanical tensions in the diaphragm structure which have a disadvantageous effect on the microphone properties. Thus, for example the sensitivity of the microphone varies with temperature. Moreover, in the case of the known microphone device an acoustic seal of the microphone structure can be realized only through a circumferential bonding of the microphone diaphragm to the layer construction of the device. However, this works against the dismantling of mechanical tensions in the diaphragm structure. In addition, the known microphone device has only one electrical device as overload protection, which is intended to prevent an electrostatic adhesion of the microphone diaphragm to the counter-element. Here, an overload protection at the substrate side for the microphone diaphragm is not provided.

BRIEF SUMMARY OF THE INVENTION

As an improvement on the device design described in US Patent Application Publication No. 2011/0311081 A1, the present invention proposes measures by which the occurrence of mechanical tensions in the microphone diaphragm is reduced, a substrate-side overload protection for the microphone diaphragm is realized, and a good acoustic sealing of the microphone structure is achieved.

According to the present invention, this is achieved in that the microphone diaphragm is bound to the base substrate via at least one flexible beam in the layer construction, and that the otherwise free edge region of the microphone diaphragm is curved in the manner of a pan, so that it extends both vertically and also at least in some regions laterally beyond the edge region of the through-opening, and the edge region of the through-opening forms a lower stop for the diaphragm movement.

Accordingly, according to the present invention it is proposed to fashion the microphone diaphragm in the form of a flexible beam diaphragm. Because in this case the diaphragm edge is largely freed from the layer construction of the device, mechanical tensions that occur for example as a result of production or as a result of temperature within the microphone diaphragm can be dismantled very effectively. According to the present invention, the diaphragm edge, having the pan-shaped curvature, at least partly overlaps the edge region of the through-opening in the base substrate. The curved diaphragm edge, surrounding a recess in the substrate surface in a largely closed manner, promotes the acoustic sensitivity of the microphone diaphragm, because during operation the flow resistance of the microphone structure for sound pressure waves can be significantly increased by drawing the diaphragm toward the counter-element. Advantageously, the pan-shaped edge region of the microphone diaphragm is moreover also formed in such a way that together with the edge region of the through-opening it forms a substrate-side overload protection for the microphone diaphragm.

In principle, there are various possibilities for the realization and design of a MEMS microphone device according to the present invention, in particular with regard to the layout of the microphone structure, the individual layer materials, and the production method.

In a preferred specific embodiment of the present invention, the edge region, having the pan-shaped curvature, of the microphone diaphragm together with the oppositely situated edge region of the counter-element forms an edge seal for the microphone structure. In this case, the edge region of the counter-element is used as an upper stop for the edge, curved in the shape of a pan, of the microphone diaphragm when, in the operating mode, this diaphragm is drawn toward the counter-element, in order to charge it with a mechanical pre-tension. In this way, not only is the microphone structure acoustically sealed; the microphone diaphragm is moreover charged with a defined mechanical pre-tension in order to increase the microphone sensitivity.

The microphone diaphragm advantageously has rounded contours, because mechanical stress mainly occurs in corner regions of the diaphragm structure. For this reason, the microphone diaphragm is preferably fashioned with rounded corners.

In addition, the concentration of stress in the diaphragm structure can be reduced by selecting curvature radii that are as large as possible in the profile cross-section between the planar mid-region of the microphone diaphragm and the edge region, having the pan-shaped curvature, of the microphone diaphragm. A curvature radius greater than 0.5 µm turns out to be particularly advantageous. In particular thermally caused mechanical tensions of the diaphragm can also be reduced through the choice of the diaphragm material. For this reason, the microphone diaphragm of the MEMS device according to the present invention is preferably realized in a semiconductor layer of the layer construction, in particular in a polycrystalline layer essentially made up of silicon and/or germanium. These layers moreover have very good mechanical properties with regard to the elasticity of the microphone diaphragm and thus the microphone sensitivity. Moreover, semiconductor layers can be easily configured as electrodes through suitable doping.

In the case of the microphone device according to the present invention, the signal acquisition takes place capacitively. A precondition of this is that the counter-element is bound fixedly in the layer construction and is acoustically permeable, so that the electrode is positionally fixed on the counter-element and only the electrode on the microphone diaphragm is deflected as a result of sound. For this purpose, in a preferred specific embodiment of the present invention the counter-element is realized in a layer composite standing under tensile stress, made of at least one electrically insulating layer and at least one conductive layer. The surface of the counter-element facing the microphone diaphragm is advantageously formed by an electrically insulating layer. In this way, a short circuit of the microphone condenser system in the case of overload situations is avoided. It turns out to be particularly advantageous if the electrically insulating layers have a high specific resistance, a mechanical tensile stress, and high mechanical breaking strength.

The counter-element can be fashioned in a layer construction deposited over the microphone diaphragm, or can also be situated on its own bearer, independently of the base substrate, with the microphone diaphragm. In this case, the layer construction of the counter-element is assembled over the microphone diaphragm on the layer construction of the base substrate. The assembly preferably takes place using a bonding method, because in this way it is easy to produce connections between the device components that are simultaneously pressure-tight and also electrically conductive. These two variant designs are explained in more detail below on the basis of the Figures.

The MEMS device according to the present invention can include, in addition to the microphone component, further MEMS and/or ASIC components, depending on the use for which it is intended.

Of particular relevance is the combination of a microphone component with a pressure sensor component. For this purpose, in a development of the MEMS device according to the present invention, laterally next to the microphone structure a pressure sensor structure is realized in the layer construction on the base substrate. This pressure sensor structure includes a pressure diaphragm that spans a cavern in the base substrate and that is provided with at least one deflectable electrode of a measurement capacitor system and a stationary counter-element that is situated in the layer construction over the pressure diaphragm and that acts as a bearer for at least one stationary electrode of the measurement capacitor system. While the pressure sensor diaphragm is fashioned in the surface of the base substrate, the counter-elements of the microphone structure and of the pressure sensor structure have the same layer construction. Correspondingly, the spacing between the microphone diaphragm and the corresponding counter-element is significantly larger than the spacing between the pressure diaphragm and the corresponding counter-element.

DETAILED DESCRIPTION OF THE INVENTION

Figure 1A:
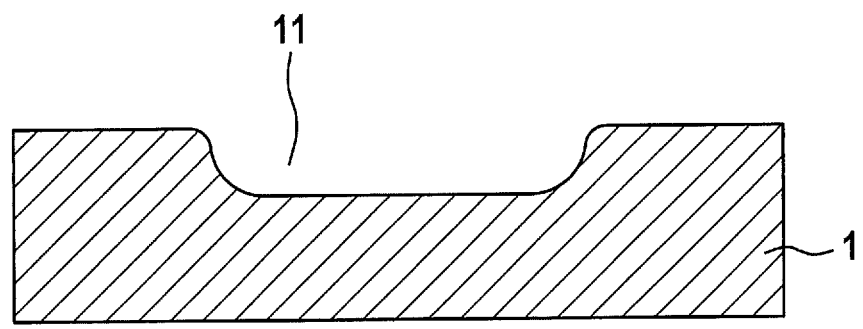
FIGS. 1a-1f illustrate a first variant construction of a MEMS microphone device 100 according to the present invention on the basis of schematic sectional representations through the layer construction during production.

The starting point for the production of a MEMS device having a microphone structure of the type under consideration here is a base substrate 1. This can be for example a monocrystalline silicon substrate, as in the exemplary embodiment described here, or can also be an SOI wafer or some other semiconductor bearer. FIG. 1a shows base substrate 1 after a recess 11 has been made in the substrate surface for the realization of the microphone diaphragm. The depth and shape of this recess 11 determine the pan shape of the microphone diaphragm. In order to avoid mechanical stresses in the diaphragm structure, here rounded-off contours have been chosen for the microphone diaphragm and, correspondingly, for recess 11. In principle, recess 11 can be produced using any structuring method. In order to obtain edges that are as rounded off as possible, in the example shown here the silicon in the region of recess 11 that is to be produced is first etched in porous fashion and then selectively exposed. In a subsequent tempering and/or CMP step, the edges of recess 11 are smoothed in the floor region and in the upper edge region. In this way, large curvature radii are achieved between the floor or the substrate surface and the side wall of recess 11. While the depth of the recess can be up to 25 µm, the curvature radius between the floor or substrate surface and the side wall can advantageously be in the range >0.5 µm.

Figure 1B:
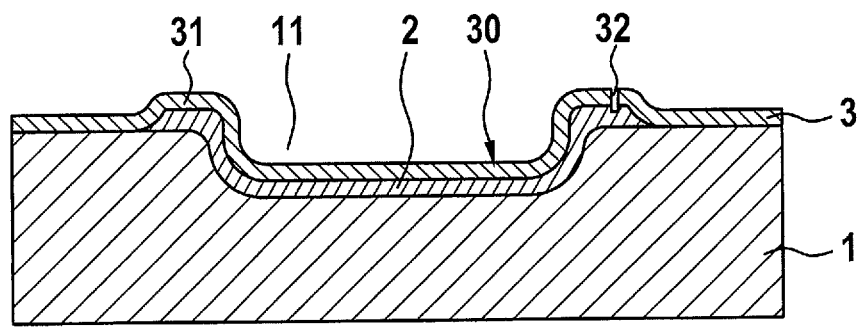

On the substrate surface structured in this way, at least one etch stop layer 2 is now deposited and structured. This etch stop layer 2 is used to limit a rear-side etching process with which, at the end of the production process, a through-opening is produced in base substrate 1 and under the microphone structure. Correspondingly, etch stop layer 2 also extends only over the floor and side wall of recess 11 and an edge region on the substrate upper side. Here, an $SiO_2$ layer is used as etch stop layer 2. It is essential that recess 11 is only coated with the etch stop material, not filled with it, so that in this way the rounded-off shaping of recess 11 remains. This is because a diaphragm layer 3—here a polysilicon layer—is then deposited and structured over etch stop layer 2. Here, microphone diaphragm 30 is defined by a circumferential etched trench 32 in diaphragm layer 3, as shown in FIG. 1b. With the aid of further etched trenches, moreover, a flexible beam 31 is applied that acts as a diaphragm suspension and as the only bonding to the rest of the layer construction, or to terminal pad 63. FIG. 1b illustrates the pan-shaped design of microphone diaphragm 30, which corresponds to the forming of recess 11 in base substrate 1. The mid-region of microphone diaphragm 30, oriented plane-parallel to the substrate plane, is situated on the floor of recess 11, and correspondingly underneath the substrate surface. This mid-region is provided with a doping, and acts as a diaphragm electrode, or as a deflectable electrode of a microphone condenser. The edge region of microphone diaphragm 30 is curved with a pan shape and, due to the expansion of etch stop layer 2, extends both vertically and horizontally beyond the edge region of recess 11. The electrical supply line for the diaphragm electrode is situated on flexible beam 31. Advantageously, it is electrically connected to base substrate 1.

Figure 1C:
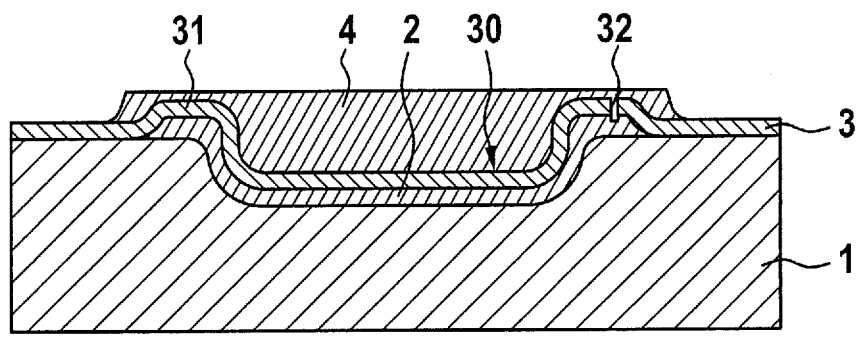

In the first exemplary embodiment described here, the counter-element of the microphone structure is realized in a layer construction that is deposited on diaphragm layer 3. For this purpose, first recess 11 remaining over diaphragm layer 3 is filled with sacrificial layer material 4, such as $SiO_2$, and subsequently the surface of the existing layer construction is leveled. The result of this filling process, which as a rule includes a plurality of deposition, structuring, and back-polishing processes, is shown in FIG. 1c.

Figure 1D:
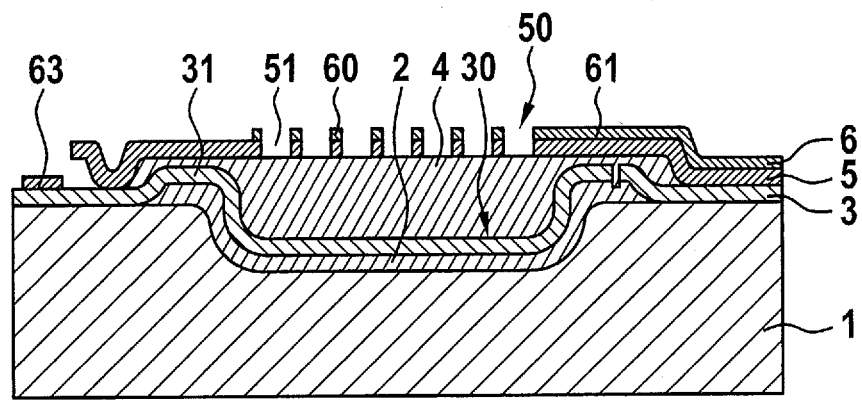

On the surface sealed in this way, the layer construction of counter-element 50 is now deposited, which here includes as lowest layer a dielectric layer 5, for example made of SiCN, which acts as a bearer for stationary counter-electrode 60 of the microphone condenser. With the aid of dielectric bearer layer 5, short circuits between the electrodes of the microphone condenser are prevented. Counter-electrode 60 is brought out by structuring together with a connecting line 61 from a metallization 6 on dielectric layer 5. In order to reduce parasitic capacitances, counter-electrode 60 extends only over the mid-region of microphone diaphragm 30. Metallization 6 can advantageously also be used as an etching mask for the structuring of dielectric layer 5. Here, ventilation openings 51 are produced over the mid-region of diaphragm layer 3, which is shown in FIG. 1d. Due to ventilation openings 51, counter-element 50 is acoustically permeable. A terminal pad 63 for microphone diaphragm 30 has been applied laterally next to counter-element 50.

Figure 1E:
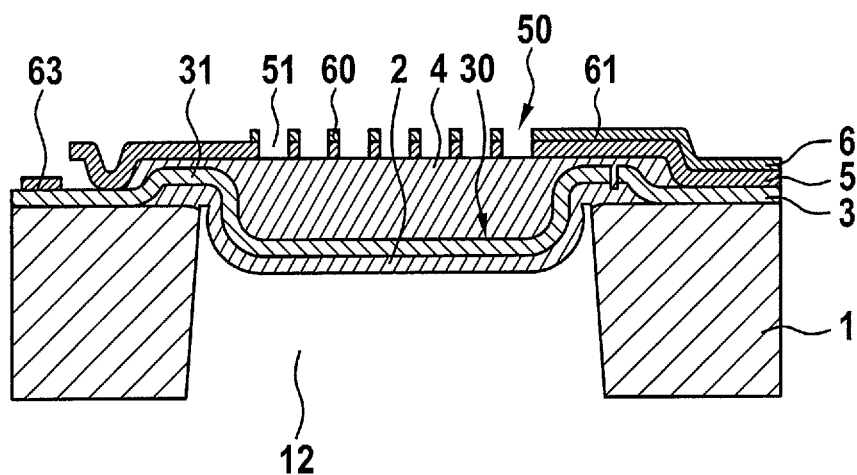

Only after the termination of the front-side processing, starting from the substrate rear side a through-opening 12 is produced in base substrate 1 under microphone diaphragm 30. As already mentioned, etch stop layer 2 forms an etch stop for this rear-side etching process. The lateral extension of through-opening 12 is limited by the type of etching process and by a corresponding masking of the substrate rear side. FIG. 1e illustrates that the entire mid-region of microphone diaphragm 30 is situated, according to the present invention, inside through-opening 12, while the diaphragm edge, curved in the manner of a pan, extends laterally and vertically beyond the edge region of through-opening 12.

Figure 1F:
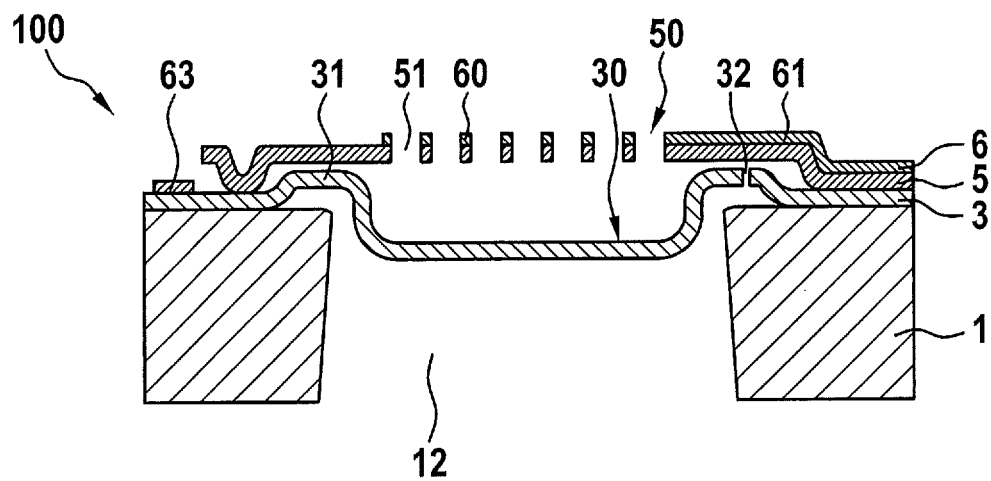

Finally, the material of etch stop layer 2 on the underside of microphone diaphragm 30 and filling material 4 on the upper side of microphone diaphragm 30 are removed in order to expose the microphone structure. This exposure takes place in a sacrificial layer etching process, for example using hydrofluoric acid vapor. FIG. 1f shows microphone device 100 produced in this way.

Deflectable microphone diaphragm 30 spans through-opening 12 in base substrate 1, and acts as a deflectable electrode of a microphone condenser not shown here in more detail. The mid-region of microphone diaphragm 30 is fashioned essentially plane-parallel to the substrate plane, and in the rest state is situated inside through-opening 12 in the base substrate. The edge region of microphone diaphragm 30 is curved in the manner of a pan, so that it extends both vertically and laterally beyond the edge region of through-opening 12. Microphone diaphragm 30 is bonded into the layer construction on base substrate 1 only by a flexible beam 31. Due to the overlap between the curved diaphragm edge and the edge region of through-opening 12, this edge region forms a lower stop for the diaphragm movement in case of overload. Stationary counter-element 50 with counter-electrode 60 of the microphone condenser is situated over microphone diaphragm 30 in the layer construction. In the region over microphone diaphragm 30, ventilation openings 51 are fashioned in counter-element 50, so that it is acoustically permeable.

The gap spacing between microphone diaphragm 30 and counter-element 50 is here relatively large. It is in a range from approximately 4 µm to 25 µm. In this way, it is possible to apply a relatively high operating voltage to the electrodes of the microphone condenser without causing snapping of microphone diaphragm 30. This has an advantageous effect on the microphone sensitivity, because the mechanical sensitivity of microphone diaphragm 30 is particularly high at operating voltages just below the pull-in voltage. Because microphone diaphragm 30 is bound to the layer construction of device 100 only via a flexible beam 31, while the remaining diaphragm edge is detached from the layer construction, microphone diaphragm 30 is as free as possible of mechanical tensions. It can easily be drawn electrostatically toward counter-element 50 by the operating voltage, and can in this way be mechanically fixed in a defined fashion. The closed edge region of counter-element 50 acts as a mechanical stop both for operation and for the case of overload for the edge region, curved in the manner of a pan, of microphone diaphragm 30, and together therewith forms an air seal that prevents a disadvantageous flow of air around microphone diaphragm 30 in the operating mode. Correspondingly, the microphone structure here has not only a substrate-side stop for microphone diaphragm 30, but also has a stop at the sides of counter-element 50.

Because according to the present invention microphone diaphragm 30 having the deflectable electrode is situated under the substrate surface, the layer construction on the substrate surface has a comparatively small height. The relatively large curvature radius between the mid-region and the curved edge region of the microphone diaphragm, >0.5 µm, contributes to the stability of the diaphragm structure and thus to the reliability of the microphone functioning.

Counter-element 50, which extends over pan-shaped microphone diaphragm 30, forms an essentially planar device surface. This has proven advantageous both in further processing and also in the packaging and flip-chip assembly of the microphone device.

Figure 2A:
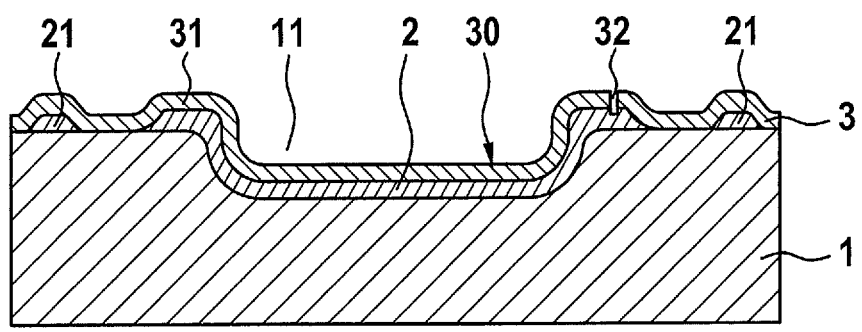
FIGS. 2a-2f illustrate a second variant construction of a MEMS microphone device 200 according to the present invention on the basis of schematic sectional representations through the layer construction during production.

The second variant design, described below in connection with FIGS. 2a through 2f, begins from a base substrate 1. As in the case of microphone device 100, for the realization of pan-shaped microphone diaphragm 30 first a rounded recess 11 is produced in the substrate surface, over which an etch stop layer 2 is then deposited for the rear-side etching process at the end of the production process. Here, however, this etch stop layer 2 extends not only over the floor and side wall of recess 11 and an edge region on the substrate upper side; concentrically thereto, in addition, a bonding region 21 is applied on the substrate surface. On the substrate surface, prepared in this way, a diaphragm layer 3 is now deposited. FIG. 2a shows the layer construction after an etched trench 32 surrounding recess 11 has been produced in diaphragm layer 3 for the definition of microphone diaphragm 30, as well as etching trenches (not shown here) for the definition of the diaphragm suspension in the form of a flexible beam 31. According to the present invention, the doped mid-region of microphone diaphragm 30 is oriented plane-parallel to the substrate plane, and is situated underneath the substrate surface. The edge region of microphone diaphragm 30 is curved in the manner of a pan and, due to the extension of etch stop layer 2, extends both vertically and horizontally beyond the edge region of recess 11.

Figure 2B:
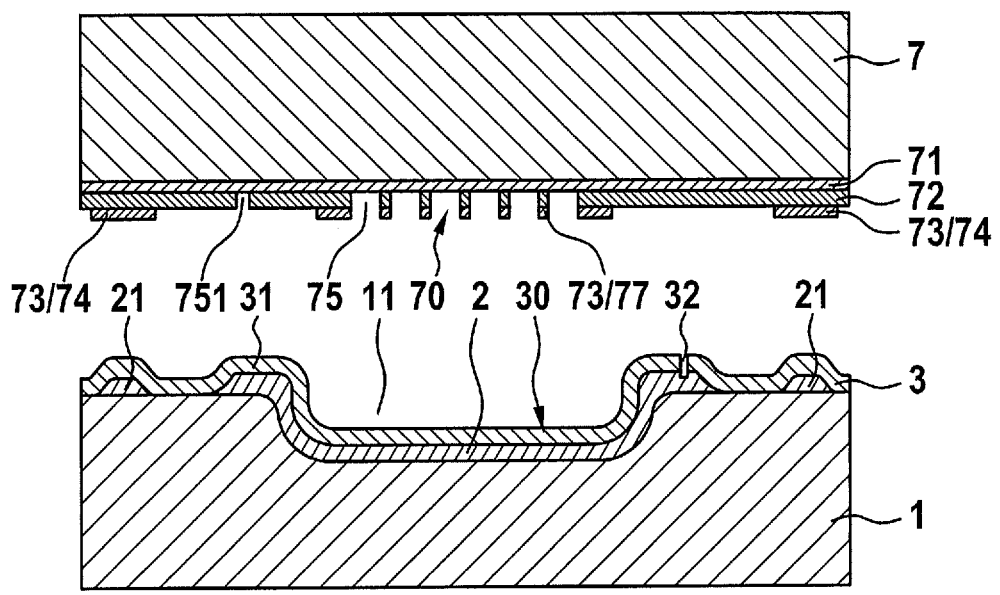

In the second exemplary embodiment described here, counter-element 70 of the microphone structure is realized independently of base substrate 1 and the layer construction for microphone diaphragm 30, in a layer construction on a further bearer substrate 7, as illustrated by FIG. 2b. On this second bearer substrate 7, first an etch stop layer 71 was deposited. Advantageously, etch stop layer 71 is made up of the same material as etch stop layer 2, namely for example $SiO_2$. Over this, a dielectric layer 72 was deposited as bearer layer for a counter-electrode 77, structured out from a further conductive layer 73 of this layer construction. This can be for example a polycrystalline layer made up essentially of silicon and/or germanium, or can also be a metallization of Al, Au, or some other suitable metal. From this layer 73, moreover, a circumferential bonding frame 74 is structured out. In a further structuring step, finally, there are also produced ventilation openings 75 in the region of counter-electrode 77, these openings extending up to etch stop layer 71, and a static pressure compensation opening 751 outside the diaphragm region. Second bearer substrate 7 prepared in this way is mounted in flip-chip technique on base substrate 1 provided with diaphragm layer 3, in such a way that counter-element 70 with ventilation openings 75 and counter-electrode 77 is situated over the mid-region of microphone diaphragm 30.

Figure 2C:
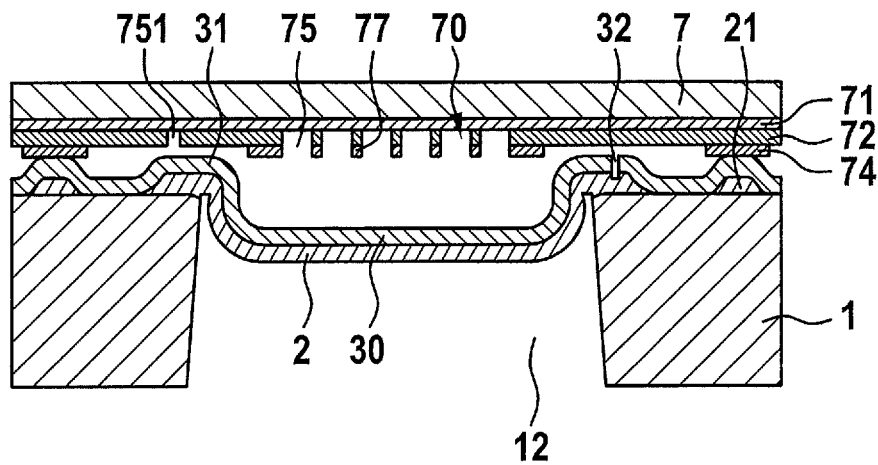

The bond between the two device components 1 and 7 is produced via bonding region 21 and bonding frame 74, as is shown in FIG. 2c. In the case of a material combination of Au—Si or Al—Ge, this can take place for example through eutectic bonding. If both the bonding region and the bonding frame are realized in poly-$Si_{1-x}$, $Ge_x$, the connection can also be produced through thermal compression bonding or through direct bonding. In the exemplary embodiment described here, bearer substrate 7 has been also been polished on the rear side. FIG. 2c shows the device design after a through-opening 12 has been produced in base substrate 1 under microphone diaphragm 30. According to the present invention, the lateral extension of this through-opening 12 was selected such that the overall mid-region of microphone diaphragm 30 is situated inside through-opening 12, while the diaphragm edge, curved in the manner of a pan, extends at least partly beyond the edge region of through-opening 12.

Here it is to be noted that through-opening 12 in base substrate 1 under microphone diaphragm 30 can also be produced only after termination of the processing, described below, of the layer construction over the microphone structure.

Figure 2D:
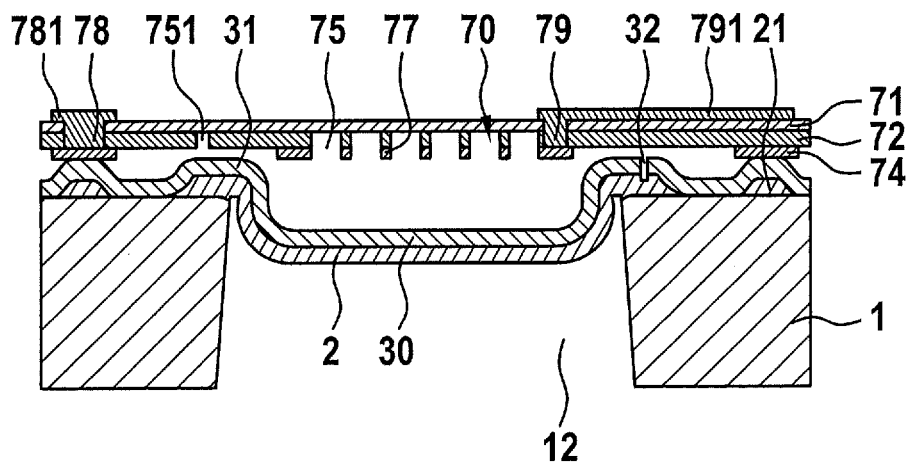

In the exemplary embodiment described here, the substrate material of bearer substrate 7 has been completely removed in an etching process limited by etch stop layer 71. The remaining layer construction was then structured in order to produce contact openings 78, 79 for counter-electrode 77 and microphone diaphragm 30. Here, contact opening 78 for microphone diaphragm 30 is situated in the region of the bond connection between the two device components. FIG. 2d shows the layer construction, structured in this way, having a metallization in which there are fashioned connecting pads 781, 791 for wire bonds or for bumps. It is essential that here both the electrical connection of microphone diaphragm 30 and also the electrical connection of counter-electrode 77 are guided on the surface of the layer construction, i.e. are situated on the device upper side. It is particularly advantageous that these connecting pads 781, 791 here are each situated in the region of the bond connection between the two device components, where the layer construction is particularly stable.

Figure 2E:
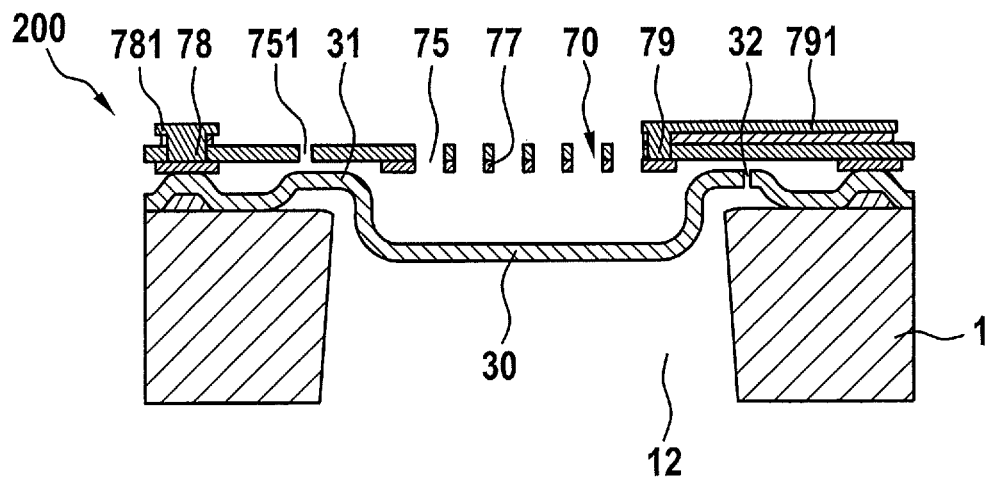
Figure 2F:
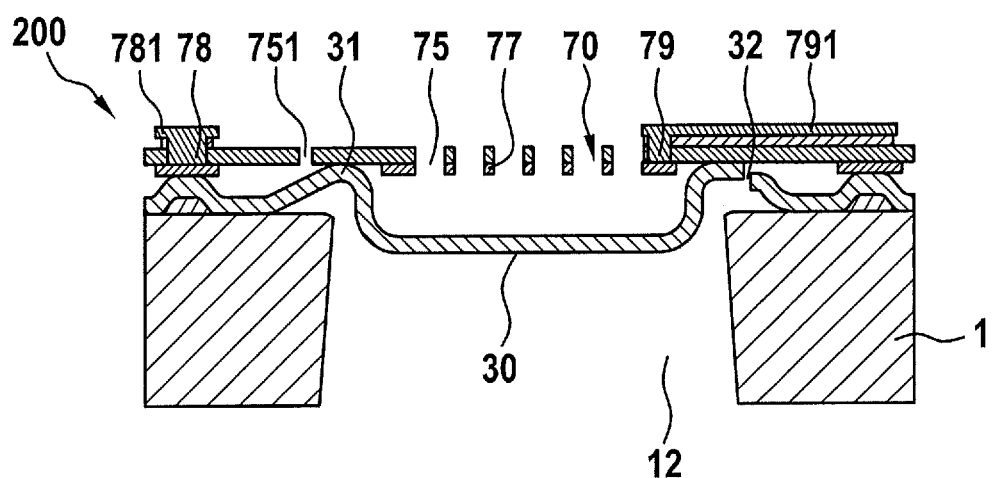

In order to expose the microphone structure, finally the material of etch stop layer 2 on the underside of microphone diaphragm 30 and the material of etch stop layer 71 on the upper side of counter-element 70 are removed in a sacrificial layer etching process. Microphone device 200 produced in this way is shown in FIGS. 2e and 2f. FIG. 2e shows the microphone structure in the rest state. Microphone diaphragm 30 is here neither pre-tensioned nor deflected as a result of sound pressure.

In contrast, FIG. 2f shows the microphone structure in the operating mode. In this mode, an operating voltage is applied to the two electrodes of the microphone condenser, i.e. between microphone diaphragm 30 and counter-electrode 77. As a result, microphone diaphragm 30 is drawn toward counter-element 70 and is charged with a mechanical pre-tension. The closed edge region of counter-element 70 acts here as a mechanical stop for the edge region, curved in the manner of a pan, of microphone diaphragm 30, and forms together therewith an acoustic seal. Static pressure compensation opening 751 in counter-element 70 is situated laterally next to the diaphragm region, outside this sealing structure.

Due to the pan-shaped construction of microphone diaphragm 30, and due to the situation of counter-electrode 77 and of its electrical terminal 79 over the mid-region of microphone diaphragm 30, a short circuit is prevented between microphone diaphragm 30 and counter-electrode 77 in the operating mode.

Figure 3:
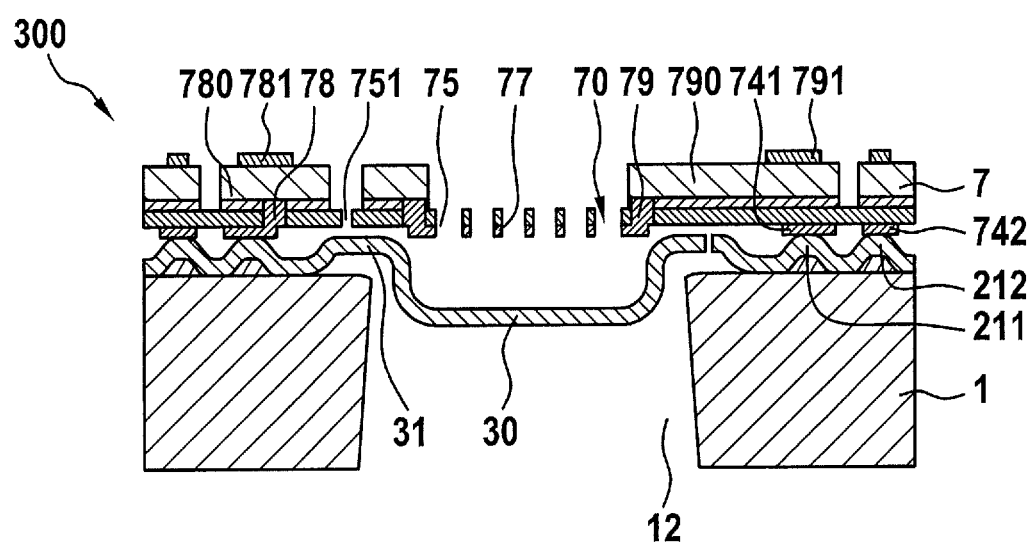
FIG. 3 shows a schematic sectional representation of a further MEMS microphone device 300 according to the present invention with bonded-on counter-element.

FIG. 3 shows a variant of the device design described above in connection with FIGS. 2a through 2f. Here as well, a deflectable microphone diaphragm 30 spans a through-opening 12 in base substrate 1, and acts as a deflectable electrode of a microphone condenser. The mid-region of the preferably round microphone diaphragm 30 is fashioned essentially plane-parallel to the substrate plane, and in the rest state is situated inside through-opening 12 in the base substrate. The edge region of microphone diaphragm 30 is curved in the manner of a pan, so that it extends both vertically and laterally beyond the edge region of through-opening 12. Microphone diaphragm 30 is bound into the layer construction on base substrate 1 only via a flexible beam 31. Due to the overlap between the curved diaphragm edge and the edge region of through-opening 12, this edge region forms a lower stop for the diaphragm movement.

In the layer plane of microphone diaphragm 30, two raised ring structures 21, 22 are fashioned that are situated concentric to microphone diaphragm 30. These ring structures 211, 212 act as bonding regions for the assembly of counter-element 70, which was realized in a layer construction on a further bearer substrate 7 independent of base substrate 1. At least outer ring structure 22 forms a circumferentially closed sealing ring for the microphone structure.

Counter-element 70 acts as bearer for counter-electrodes 77 of the microphone condenser, and is situated over microphone diaphragm 30. Ventilation openings 75 over the mid-region of microphone diaphragm 30 ensure that counter-element 70 is acoustically permeable.

In order to construct counter-element 70, first an etch stop layer 71, and over this a dielectric layer 72, were deposited on highly doped bearer substrate 7. These two layers 71, 72 were then structured in order to produce electrical contacts 78, 79 between subsequently deposited conductive layer 73 and bearer substrate 7. From conductive layer 73, on the one hand counter-electrode 77 was structured out, and on the other hand two circumferential bonding frames 741, 742 were structured out that, corresponding to bonding regions 211, 212 in the layer construction, are situated on base substrate 1. In a further structuring step, finally, ventilation openings 75 were produced in the region of counter-electrode 77, extending up to etch stop layer 71. Bearer substrate 7 prepared in this way was then bonded, using flip-chip technique, onto the layer construction of base substrate 1, so that counter-element 70 with ventilation openings 75 and with counter-electrode 77 is situated over the mid-region of microphone diaphragm 30.

In contrast to microphone device 200, bearer substrate 7 in the case of microphone device 300 was not completely removed, but was only thinned at the rear side and then structured. Here, the substrate material 7 over the mid-region of microphone diaphragm 30 was removed. Moreover, individual regions of bearer substrate 7 were electrically decoupled, in particular a connecting region 780 for microphone diaphragm 30 with a connecting pad 781 and a connecting region 790 for counter-electrode 77 with a connecting pad 791. The remaining substrate material 7 is used to reinforce and rigidify counter-element 70, and therefore to stabilize the overall device structure. Therefore, the two electrical terminals 781 and 791 are here as well situated on the device upper side, each in the region of the bond connection between the two device components.

After the microphone structure has been exposed in a sacrificial layer etching process, in which the material of etch stop layer 2 on the underside of microphone diaphragm 30 and the material of etch stop layer 71 on the upper side of counter-element 70 was removed, there results a relatively large gap spacing between microphone diaphragm 30 and counter-element 70, in a range from approximately 4 µm to 25 µm. The edge region of counter-element 70 acts as a mechanical stop for the edge region, curved in the manner of a pan, of microphone diaphragm 30, and forms together therewith an air seal. Correspondingly, the microphone structure here includes not only a substrate-side stop for microphone diaphragm 30, but also a stop on sides of counter-element 70.

Figure 4A:
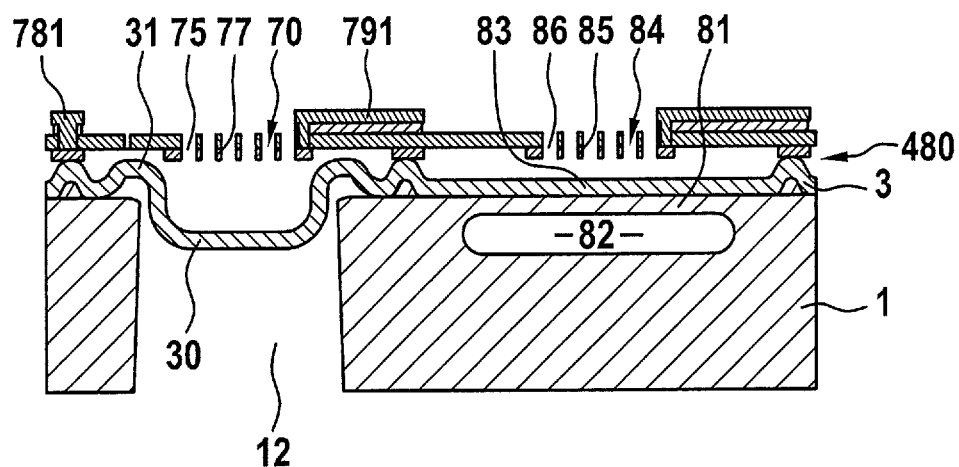
FIGS. 4a and 4b show a schematic sectional representation of a MEMS microphone device 401 and 402, respectively, according to the present invention having a pressure sensor component.
Figure 4B:
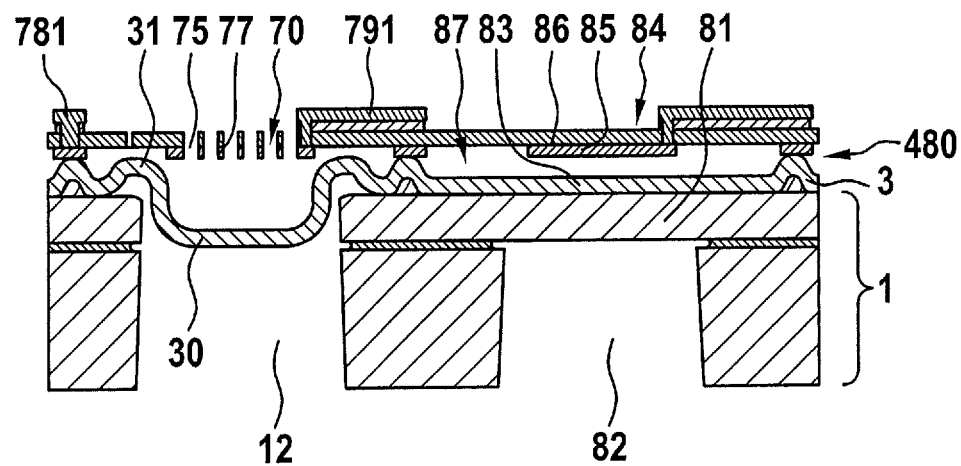

MEMS devices 401 and 402 shown in FIGS. 4a and 4b each include a microphone component as described in connection with FIGS. 2a through 2f. For this reason, reference is made here to the above statements. Moreover, in both MEMS devices 401 and 402 a pressure sensor component is realized laterally next to the microphone component in the layer construction of the device, based on the same capacitive conversion design as the microphone component.

The pressure sensor component includes in each case a pressure diaphragm 81 that spans a cavern 82 in base substrate 1 and that is provided with at least one deflectable electrode 83 of a measurement capacitor system, and a stationary counter-element 84 that is situated in the layer construction over pressure diaphragm 81 and that acts as a bearer for at least one stationary electrode 85 of the measurement capacitor system. Pressure sensor diaphragm 81 is fashioned in the surface of base substrate 1, diaphragm electrode 83 having been realized in diaphragm layer 3 on the base substrate. Counter-elements 70, 84 of the microphone structure and of the pressure sensor structure each have the same layer construction, so that the spacing between microphone diaphragm 30 and corresponding counter-element 70 is significantly larger than the spacing between pressure diaphragm 81 and corresponding counter-element 85. This spacing is determined by the connection between base substrate 1 and the layer construction of counter-element 70. Thus, the gap spacing of the microphone component, due to the pan-shaped realization of microphone diaphragm 30, is greater than 4 µm, preferably even greater than 6 µm, while the gap spacing of the pressure sensor component corresponding to bonded connection 480 is less than 4 µm.

In the case of MEMS device 401, pressure diaphragm 81 was produced in a surface micromechanical technique, and spans a cavern 82, closed at the rear side, in base substrate 1. Because here a monocrystalline silicon wafer acts as base substrate 1, at least the bearer layer of pressure diaphragm 81 is also monocrystalline, and correspondingly has good mechanical properties. The pressure charging takes place via ventilation openings 86 in counter-element 84, whose extensions are advantageously smaller than the gap spacing of the pressure sensor component. Cavern 82 here acts as a reference pressure volume.

In contrast, in the case of MEMS device 402 pressure sensor diaphragm 81 was exposed in a rear-side etching process in the silicon layer of an SOI wafer that here was used as base substrate 1. Counter-element 84 is closed here, and gap 87 between pressure diaphragm 81 and counter-element 84 is sealed in pressure-tight fashion via a circumferential bonding connection 480 between base substrate 1 and counter-element 84. In the case of MEMS device 402, the pressure charging takes place via cavern 82, open at the rear side. Gap 87 is used as reference pressure volume.

What is claimed is:

1. A MEMS device having a microphone structure realized in a layer construction on top of a base substrate, comprising:
   the base substrate;
   a deflectable microphone diaphragm, formed in a diaphragm layer in the layer construction, which (i) at least partly spans a through-opening in the base substrate, and (ii) is provided with at least one deflectable electrode of a microphone condenser system; and
   a stationary counter-element having ventilation openings, the stationary counter element being formed in a composite layer above the diaphragm layer in the layer construction, the stationary counter-element acting as a bearer for at least one stationary electrode of the microphone condenser system;
   wherein the mid-region of the microphone diaphragm is fashioned essentially plane-parallel to a substrate plane, and in a rest state a mid-region of the microphone diaphragm is situated inside the through-opening in the base substrate, and wherein the microphone diaphragm is bonded onto the base substrate via at least one flexible beam, and wherein a free edge region of the microphone diaphragm is curved in so that the free edge region extends both vertically and, at least in some areas, also laterally beyond the edge region of the through-opening, and the edge region of the through-opening forms a lower stop for the diaphragm movement;
   wherein the edge region of the microphone diaphragm and an edge region of the counter-element are capable of forming together an edge seal for the microphone structure; and
   wherein the microphone diaphragm has rounded contours.

2. The MEMS device as recited in claim 1, wherein a curvature radius between the planar mid-region of the microphone diaphragm and the edge region, of the microphone diaphragm is greater than 0.5 pm.

3. The MEMS device as recited in claim 1, wherein the diaphragm layer is made of a semiconductor.

4. The MEMS device as recited in claim 1, further comprising:

a pressure sensor structure realized laterally next to the microphone structure in the layer construction on the base substrate, wherein the pressure sensor structure includes:
  a pressure diaphragm which spans a cavern in the base substrate and provided with at least one deflectable electrode of a measurement capacitor system; and
  a stationary counter-element which is situated in the layer construction over the pressure diaphragm and acts as a bearer for at least one stationary electrode of the measurement capacitor system;
  wherein the pressure sensor diaphragm is realized in the surface of the base substrate, and the counter-elements of the microphone structure and of the pressure sensor structure have the same layer construction, so that a spacing between the microphone diaphragm and the corresponding counter-element is larger than a spacing between the pressure diaphragm and the corresponding counter-element.

* * * * *